(12) United States Patent
Nawata et al.

(10) Patent No.: US 7,060,133 B2
(45) Date of Patent: Jun. 13, 2006

(54) SINGLE CRYSTAL PULLING APPARATUS FOR A METAL FLUORIDE

(75) Inventors: Teruhiko Nawata, Shunan (JP);
Hidetaka Miyazaki, Shunan (JP);
Hiroyuki Yanagi, Shunan (JP);
Shinichi Nitta, Chofu (JP); Harumasa Ito, Chofu (JP); Isao Yamaga, Chofu (JP)

(73) Assignee: Tokuyama Corporation (JP)

( * ) Notice: Subject to any disclaimer, the term of this patent is extended or adjusted under 35 U.S.C. 154(b) by 61 days.

(21) Appl. No.: 10/717,018

(22) Filed: Nov. 19, 2003

(65) Prior Publication Data

US 2004/0099210 A1 May 27, 2004

(30) Foreign Application Priority Data

Nov. 19, 2002 (JP) .............................. 2002-334528

(51) Int. Cl.
*C30B 15/14* (2006.01)
(52) U.S. Cl. ..................... 117/213; 117/214; 117/217; 117/218; 117/940
(58) Field of Classification Search ................ 117/213, 117/214, 218, 217, 940
See application file for complete search history.

(56) References Cited

U.S. PATENT DOCUMENTS

| | | | | |
|---|---|---|---|---|
| 3,359,077 A | * | 12/1967 | Arst ............................. | 117/30 |
| 3,716,341 A | * | 2/1973 | Schmidt et al. ............. | 117/217 |
| 5,248,378 A | * | 9/1993 | Oda et al. .................... | 117/217 |
| 5,846,323 A | * | 12/1998 | Egami et al. ................ | 117/217 |
| 5,938,842 A | * | 8/1999 | Sakurada et al. ........... | 117/217 |
| 5,997,635 A | * | 12/1999 | Kubota et al. ................ | 117/14 |
| 6,117,234 A | * | 9/2000 | Yamagishi .................... | 117/218 |
| 6,217,648 B1 | * | 4/2001 | Shiraishi ....................... | 117/14 |
| 6,369,392 B1 | | 4/2002 | Ruderman et al. | |
| 6,821,344 B1 | * | 11/2004 | Park ............................. | 117/217 |

FOREIGN PATENT DOCUMENTS

| JP | 63-270385 A | 11/1988 |
|---|---|---|
| JP | 10-338594 A | 12/1998 |
| JP | 11-021197 A | 1/1999 |

* cited by examiner

*Primary Examiner*—Robert Kunemund
(74) *Attorney, Agent, or Firm*—The Webb Law Firm, P.C.

(57) ABSTRACT

A single crystal pulling apparatus for a metal fluoride comprising a crucible provided in a chamber for filling with a molten solution of a single crystal material, a melting heater provided to surround the crucible, a vertically movable single crystal pulling bar for attaching a seed crystal on a tip thereof for coming in contact with the molten solution of the single crystal material in the crucible, a heat insulating wall provided in the chamber to surround at least a peripheral side portion of a single crystal pulling region in an upper part of the crucible, a ceiling board for closing an opening portion of an upper end in an upper part of the heat insulating wall, and a single crystal pulling chamber surrounded by the heat insulating wall and the ceiling board, wherein the ceiling board is provided with at least an inserting hole for inserting the single crystal pulling bar, and wherein a coefficient of thermal conductivity in a direction of a thickness of the ceiling board is 1000 to 50000 W/m²·K.

8 Claims, 4 Drawing Sheets

PRIOR ART

PRIOR ART

SINGLE CRYSTAL PULLING APPARATUS FOR A METAL FLUORIDE

TECHNICAL FIELD

The present invention relates to a single crystal pulling apparatus for a metal fluoride such as calcium fluoride by a pulling method (Czochralski method).

BACKGROUND ART

For example, a single crystal of a metal fluoride such as calcium fluoride, barium fluoride, magnesium fluoride or lithium fluoride has a high transmittance over a wavelength band within a wide range, and has a low dispersion and an excellent chemical stability.

For this reason, there is a high demand for single crystals of these metal fluorides for use as optical materials in various devices using a laser having an ultraviolet wavelength or a vacuum ultraviolet wavelength, in a lens of a camera or a CVD device and as a window material.

In the single crystals of the metal fluorides, particularly, the single crystal of calcium fluoride has been expected as a projection lens to be used for an $F_2$ excimer laser (wavelength: 157 nm) in a vacuum ultraviolet wavelength region which has been developed as a short-wavelength light source in the next generation in an optical lithographic technique to be a main stream in the production of a semiconductor device.

Conventionally, it is known that such a single crystal of a metal fluoride can be manufactured by a crucible dropping method (Bridgman-Stockbarger method) and by a pulling method (Czochralski method).

The pulling method is not restrained by a crucible during the raising of a single crystal. Therefore, a distortion is hardly generated on the crystal, and furthermore, an impurity can be reduced by a segregation phenomenon during the raising. Consequently, the pulling method has been generally used in the manufacture of a semiconductor single crystal such as silicon or germanium.

In the pulling method, a seed crystal comprising a single crystal to be an object is caused to come in contact with a molten solution of a single crystal manufacturing material in a crucible, and subsequently, the seed is gradually pulled out of the heating area of the crucible and is thus cooled, thereby raising the single crystal below the seed crystal.

In order to execute such a pulling method, conventionally, there has been used a single crystal pulling apparatus 100 shown in FIG. 2.

The single crystal pulling apparatus 100 comprises a chamber 102 constituting a crystal growth furnace, and the chamber 102 includes a rotatable support shaft 106 to penetrate through a bottom wall 104 of the chamber 102.

The lower end of the support shaft 106 penetrates through the bottom wall 104 of the chamber 102 and is extended out of the chamber 102, and comes in contact with a cooler and is then connected to a driving mechanism for rotating and vertically moving a crucible 110, which is not shown.

Moreover, a base 108 is fixed to the support shaft 106 and the crucible 110 is mounted on the upper surface of the base 108. A molten solution 112 of a single crystal manufacturing material is filled in the crucible 110.

A melting heater 114 is erected from the bottom wall 104 of the chamber 102 to surround the crucible 110. Furthermore, a heat insulating wall 116 is erected from the bottom wall 104 of the chamber 102 to surround the melting heater 114 and the crucible 110.

Usually, the height of the upper end of the melting heater 114 is almost equal to that of the upper end of the crucible 110.

On the other hand, a vertical movable and rotatable single crystal pulling bar 122 is hung down from an upper wall 118 of the chamber 102 through an opening portion 120 by means of the driving means which is not shown. A seed crystal 124 is attached to the tip of the single crystal pulling bar 122 through a holding tool 123, and the seed crystal 124 is provided to be positioned on the central axis of the crucible 110.

In the single crystal pulling apparatus 100 having such a structure, the single crystal pulling bar 122 is brought down toward the molten solution 112 of the single crystal manufacturing material set in a melting state in the crucible 110 by the heating operation of the melting heater 114. Then, the lower end plane of the seed crystal 124 provided on the tip of the single crystal pulling bar 122 comes in contact with the molten material solution 112 in the crucible 110 and the single crystal pulling bar 122 is thereafter pulled up so that a single crystal 126 is grown under the seed crystal 124.

In FIG. 2, the reference numeral 128 denotes an inspection window provided on the top of the chamber.

In the conventional single crystal pulling apparatus 100 having such a structure, for example, which has generally been used in the manufacture of a single crystal having a comparatively high crystal growth speed of silicon or the like, the upper end of the heat insulating wall 116 surrounding the melting heater 114 and the crucible 110 is generally provided to have a slightly greater height than the height of the upper end of the crucible 110 as shown in FIG. 2.

More specifically, since the crystal growth speed is comparatively high in the single crystal of silicon or the like, the heat of the crucible 110 can be sufficiently retained. In order to radiate a crystallization heat, it is preferable that the upper end of the heat insulating wall 116 should be positioned to have such a height as to be slightly greater than the height of the upper end of the crucible 110.

In the case in which a single crystal of a metal fluoride is manufactured by using such a conventional single crystal pulling apparatus 100, however, there is often a problem in that a crack is generated on the single crystal thus pulled up.

The reason is that the crystal growth speed of the single crystal of the metal fluoride is extremely lower than that of the single crystal of silicon or the like. More specifically, in the case in which the pulling apparatus 100 including the upper end of the heat insulating wall 116 positioned to have such a height as to be slightly greater than the height of the upper end of the crucible 110 is used for the single crystal of the metal fluoride having an extremely low crystal growth speed as described above, the heat insulating wall 116 is not present in the single crystal pulling region provided above the crucible 110. As a result, the gradient of a reduction in a temperature is increased after all and it is hard to grow a crystal stably and slowly.

For this reason, a single crystal pulling apparatus disclosed in Japanese Laid-Open Patent Publication No. Sho 63(1988)-270385 has been proposed for an apparatus for pulling a single crystal of an oxide such as $LiTaO_3$ having a comparatively low crystal growth speed (see pages 1 to 2 and FIG. 2 in the publication).

A single crystal pulling apparatus 200 disclosed in the Japanese Laid-Open Patent. Publication No. Sho 63(1988)-270385 has a structure shown in FIG. 3.

More specifically, in the single crystal pulling apparatus 200, a base 204 is provided on a furnace body bottom portion 202 and an alumina table 206 is provided on the base 204. A crucible 210 formed of iridium is provided above the alumina base 206 through a crucible base 208 and an after heater 212 formed of iridium is provided on the crucible 210.

A temperature retaining cylinder 214 is provided to surround the circumference of the crucible 210 and a single crystal pulling region, formed above the crucible 210. Moreover, a zirconia bubble 216 is provided between the temperature retaining cylinder 214 and the crucible 210. A high-frequency coil 218 for heating is provided to surround the temperature retaining cylinder 214.

Furthermore, an upper cover (a ceiling board) 222 is provided on an opening portion 220 formed on the upper end of the temperature retaining cylinder 214, thereby closing the opening portion 220. The ceiling board 222 is provided with an inserting hole 225 for a single crystal pulling bar 224 and the single crystal pulling bar 224 is inserted through the inserting hole 225. Moreover, a seed crystal (seed) 226 is provided on the tip of the single crystal pulling bar 224. When the single crystal pulling bar 224 is pulled up, a single crystal 228 is grown under the seed crystal 226.

In the Japanese Laid-Open Patent Publication No. Sho 63(1988)-270385, in the single crystal pulling apparatus 200 having such a structure, it has been proposed that an opening area between the ceiling board 222 and the single crystal pulling bar 224, that is, an opening area between the single crystal pulling bar 224 and the inserting hole 225 is regulated to control a temperature gradient in a position placed just above a molten material solution by 5 mm in the crucible 210, thereby preventing the generation of a crack in a single crystal.

According to the single crystal pulling apparatus 200 having such a structure, the single crystal pulling region is held in a chamber (a single crystal pulling chamber) 230 formed by the temperature retaining cylinder 214 and the ceiling board 222. Consequently, a heat retaining property can be greatly enhanced and a gradient of a reduction in a temperature in such a direction as to go toward the upper part of the same region can be decreased considerably.

According to such a conventional single crystal pulling apparatus 200, therefore, it is possible to manufacture a single crystal of an oxide such as LiTaO$_3$ with the generation of a crack suppressed considerably.

In the case in which a single crystal of a metal fluoride is manufactured by using such a single crystal pulling apparatus 200, however, the crystal growth speed of the single crystal of the metal fluoride is extremely low. As a result, with respect to the single crystal of the metal fluoride, the heat retaining property in the single crystal pulling region becomes excessive and the gradient of the reduction in the temperature in the single crystal pulling region becomes insufficient so that it is hard to sufficiently grow a single crystal in many cases.

On the condition that the single crystal is grown, similarly, the generation of the crack cannot be suppressed at such a high level as to be satisfied. In the case in which the metal fluoride is calcium fluoride or the case in which the crucible to be provided is a large-sized apparatus having an inside diameter of 11 cm or more, particularly, the crack is still generated considerably.

In the Japanese Laid-Open Patent Publication No. Sho 63(1988)-270385, furthermore, the material of the ceiling board 222 is not considered at all. From the fact that the thickness of the ceiling board 222 is greater than that of the heat insulating material of a side wall and the fact that the hatching pattern of the thickness of the ceiling board 222 is displayed to be the same as the hatching of the alumina table 206 to be a bottom cover, it can be guessed that the ceiling board 222 is formed by a heat insulating material as the same member as the alumina table 206 or the temperature retaining cylinder 214.

According to the investigations of the present inventors, therefore, the metal fluoride such as calcium fluoride is particularly required to be cooled uniformly and gradually in order to grow a stable crystal. On the other hand, in a method of controlling a reduction in the temperature of the single crystal pulling region by regulating the opening area between the single crystal pulling bar 224 and the inserting hole 225 as in the Japanese Laid-Open Patent Publication No. Sho 63(1988)-270385 and a method in which the heat insulating properties and coefficient of thermal conductivity of the ceiling board 222 and the temperature retaining cylinder 214 are not considered at all, it can be guessed that non-uniformity is generated in a temperature distribution in a radial direction or a vertical direction, resulting in a hindrance to a stable crystal growth.

Furthermore, Japanese Laid-Open Patent Publication No. Hei 11(1999)-21197 has disclosed a single crystal pulling apparatus 300 for the metal fluoride such as calcium fluoride.

In a single crystal pulling apparatus 300 disclosed in the Japanese Laid-Open Patent Publication No. Hei 11(1999)-21197, a crucible 304 is provided in a growth furnace chamber 302 and a heater 306 is provided around the crucible 304 as shown in FIG. 4.

A heat insulating member 308 is provided to surround the crucible 304 and the heater 306. An inward extended portion 310 is provided in the upper part of the heat insulating member 308 to cover the upper portion of the heater 306.

Furthermore, a molten solution 316 is filled in the crucible 304 and a seed crystal 314 provided on the tip of a single crystal pulling bar 312 is constituted to come in contact with the molten solution 316 in the crucible 304.

In the single crystal pulling apparatus 300, however, the inward extended portion 310 of the heat insulating member 308 simply covers the upper part of the heater 306 in order to efficiently carry out the heating operation of the heater 306. Furthermore, an opening having considerable large area is present between the crucible 304 and the single crystal pulling bar 312.

In the single crystal pulling apparatus 300, accordingly, the upper end of the heat insulating member 308 is basically positioned to have a slightly greater height than the height of the upper end of the crucible 304 in the same manner as in the conventional single crystal pulling apparatus 100 shown in FIG. 1. In the case in which the single crystal pulling apparatus 300 is used for the single crystal of the metal fluoride which has an extremely low crystal growth speed, a gradient of a reduction in a temperature is increased after all, because the heat insulating member 308 is not present in the single crystal pulling region provided above the crucible 304. As a result, it is difficult to grow a crystal stably and slowly. Therefore, a crack is generated on the single crystal which is pulled up.

Also in all the conventional single crystal manufacturing apparatuses, therefore, it is a great object to develop a single crystal pulling apparatus which can improve the nonuniformity of a temperature distribution in the single crystal pulling region and can manufacture the single crystal of a metal fluoride well without generating a crack.

In order to solve the problems, the present inventors vigorously made a study. As a result, they found that the above-mentioned problems can be solved by forming a ceiling board with a material having a high coefficient of thermal conductivity in a single crystal pulling apparatus, and completed the present invention.

SUMMARY OF THE INVENTION

The present invention has been made to solve the problems and to attain the object in the prior art described above, and provides a single crystal pulling apparatus for a metal fluoride, comprising:

a chamber constituting a crystal growth furnace;

a crucible provided in the chamber and filling a molten solution of a single crystal manufacturing material;

a melting heater provided to surround the crucible;

a vertically movable single crystal pulling bar including a seed crystal on a tip, and coming in contact with the molten solution of the single crystal manufacturing material filled in the crucible;

a heat insulating wall provided in the chamber to surround at least a peripheral side portion of a single crystal pulling region in an upper part of the crucible;

a ceiling board for closing an opening portion of an upper end in an upper part of the heat insulating wall; and a single crystal pulling chamber surrounded by the heat insulating wall and the ceiling board, wherein the ceiling board is provided with at least an inserting hole for inserting the single crystal pulling bar, and a coefficient of thermal conductivity in a direction of a thickness of the ceiling board is 1000 to 50000 $W/m^2 \cdot K$.

According to the single crystal pulling apparatus for a metal fluoride having such a structure, the single crystal pulling region is held in the single crystal pulling chamber formed by the heat insulating wall and the ceiling board. Consequently, a heat retaining property can be greatly enhanced.

In addition, a member having the coefficient of thermal conductivity in the direction of the thickness of 1000 to 50000 $W/m^2 \cdot K$ is used as the ceiling board. In the single crystal pulling chamber, therefore, the heat radiation from the ceiling board is also increased properly. Consequently, the single crystal pulling chamber is cooled slowly in a radial direction and a direction of a height. As a result, the nonuniformity of a temperature distribution can be improved remarkably.

In the single crystal pulling region, accordingly, the single crystal is cooled slowly and uniformly so that a crystal can be grown more stably. Even if the single crystal is a metal fluoride such as calcium fluoride which has an extremely low crystal growth speed, therefore, it is possible to suppress the generation of a crack very highly.

Moreover, the single crystal pulling apparatus for a metal fluoride according to the present invention is characterized in that the coefficient of thermal conductivity in the direction of the thickness of the heat insulating wall is 100 $W/m^2 \cdot K$ or less.

If the coefficient of thermal conductivity in the direction of the thickness of the heat insulating wall is set within such a range, the single crystal pulling chamber is also cooled slowly in the radial direction. As a result, the nonuniformity of the temperature distribution can be improved remarkably. In the single crystal pulling region, the single crystal is cooled slowly and uniformly so that a crystal is grown more stably. Even if the single crystal is a metal fluoride such as calcium fluoride, therefore, it is possible to suppress the generation of a crack very highly.

Furthermore, the single crystal pulling apparatus for a metal fluoride according to the present invention is characterized in that the ceiling board is a graphite plate.

If the ceiling board is the graphite plate, thus, the desirable coefficient of thermal conductivity described above can be attained and a resistance to a severe environment in the pulling and a mechanical strength are also excellent.

Moreover, the single crystal pulling apparatus for a metal fluoride according to the present invention is characterized in that the ceiling board is positioned in a higher place than an upper end of the crucible by 50 to 500% of a maximum inside diameter of the crucible.

The ceiling board is positioned within such a range. Consequently, it is possible to sufficiently maintain the single crystal pulling region required for pulling the single crystal of the metal fluoride having a practical size in the internal space portion of the single crystal pulling chamber. As a result, a heat retaining property can be enhanced greatly, and the single crystal is cooled slowly and uniformly so that a crystal can be grown more stably in the single crystal pulling region. Even if the single crystal is a metal fluoride such as calcium fluoride which has an extremely low crystal growth speed, therefore, it is possible to suppress the generation of a crack very highly.

Furthermore, the single crystal pulling apparatus for a metal fluoride according to the present invention is characterized in that a total opening area of apertures formed on the ceiling board is 5 to 60% of an opening area of an upper end in a circular enclosure of the heat insulating wall.

By regulating the total opening area of the apertures formed on the ceiling board within such a range, it is possible to control the heat radiating property in the single crystal pulling chamber and to control a gradient of a reduction in a temperature toward the upper part of the single crystal pulling region to be proper for pulling the single crystal of the metal fluoride.

Moreover, the single crystal pulling apparatus for a metal fluoride according to the present invention is characterized in that the metal fluoride is calcium fluoride.

In the single crystal pulling region, thus, the single crystal is cooled slowly and uniformly so that a crystal can be grown more stably. Even if the single crystal is calcium fluoride which has an extremely low crystal growth speed, therefore, it is possible to suppress the generation of a crack very highly.

Furthermore, the single crystal pulling apparatus for a metal fluoride according to the present invention is characterized in that the crucible has an inside diameter of 11 cm or more.

More specifically, in the case in which there is employed a large-sized single crystal pulling apparatus for a metal fluoride in which a crucible has an inside diameter of 11 cm or more, which leads to the generation of a crack on the single crystal remarkably, the advantage can be produced particularly strikingly so that a large-sized single crystal having no crack can be manufactured.

DETAILED DESCRIPTION OF THE INVENTION

An embodiment (example) of the present invention will be described below in more detail with reference to the drawings.

Figure 1:
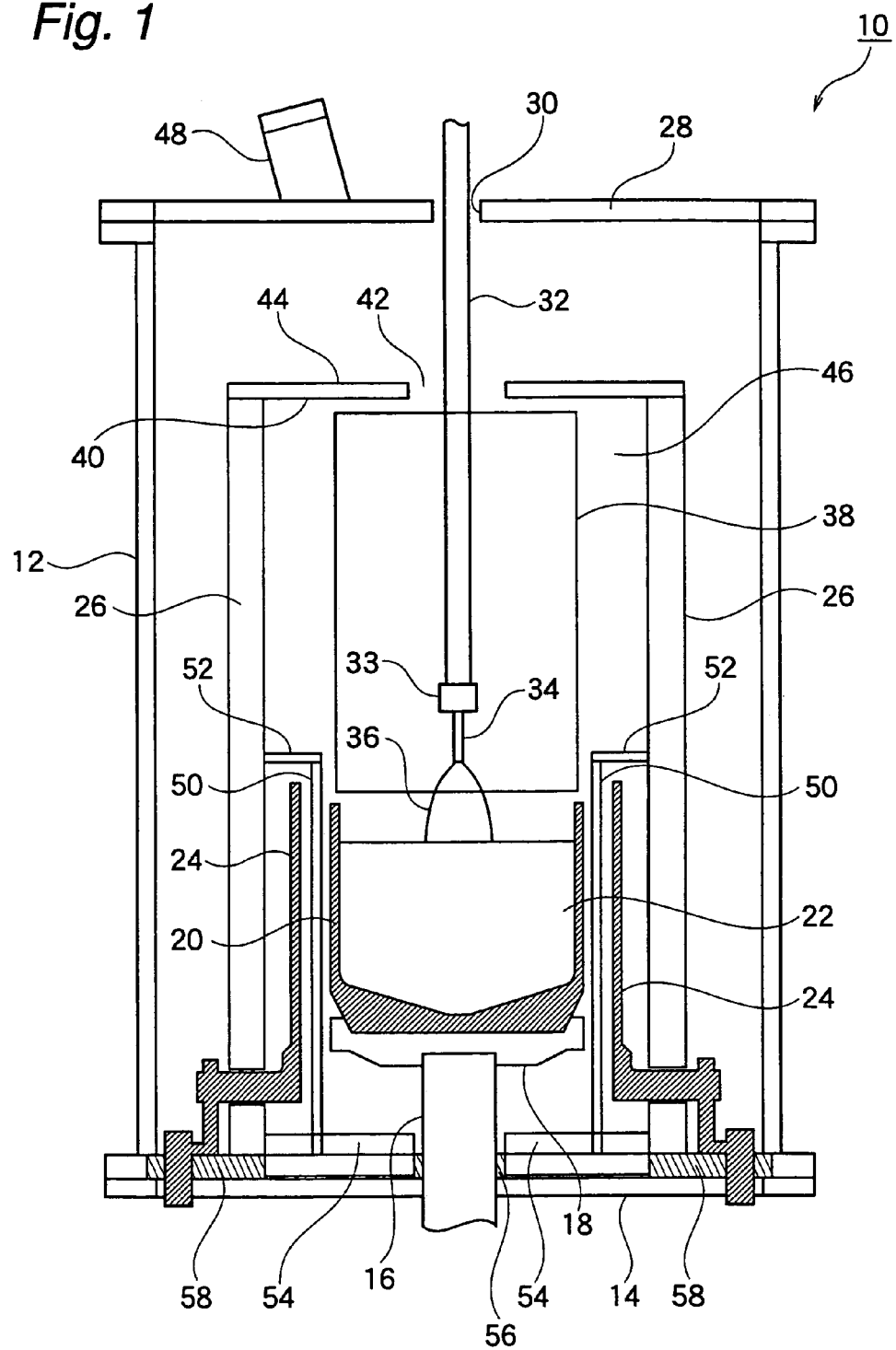
FIG. 1 is a schematic view showing an example of a single crystal pulling apparatus according to the present invention.

FIG. 1 is a schematic view showing an example of a single crystal pulling apparatus according to the present invention.

A single crystal pulling apparatus 10 comprises a chamber 12 constituting a crystal growth furnace, and the chamber 12 includes a rotatable support shaft 16 to penetrate through a bottom wall 14 of the chamber 12.

The lower end of the support shaft 16 penetrates through the bottom wall 14 of the chamber 12 and is extended out of the chamber 12, and comes in contact with a cooler and is then connected to a driving mechanism for rotating and vertically moving a crucible 20, which is not shown.

Moreover, a base 18 is fixed to the support shaft 16 and the crucible 20 is mounted on the upper surface of the base 18. A molten solution 22 of a single crystal manufacturing material is filled in the crucible 20.

A melting heater 24 is erected from the bottom wall 14 of the chamber 12 to surround the crucible 20. Furthermore, a heat insulating wall 26 is erected from the bottom wall 14 of the chamber 12 to surround the melting heater 24 and the crucible 20.

On the other hand, a vertical movable and rotatable single crystal pulling bar 32 is hung down from an upper wall 28 of the chamber 12 through an opening portion 30 by means of the driving means which is not shown. A seed crystal 34 is attached to the tip of the single crystal pulling bar 32 through a holding tool 33, and the seed crystal 34 is provided to be positioned on the central axis of the crucible 20.

In the single crystal pulling apparatus 10 having such a structure, the single crystal pulling bar 32 is brought down toward the molten solution 22 of a single crystal manufacturing material set in a melting state in the crucible 20 by the heating operation of the melting heater 24. Then, the lower end plane of the seed crystal 34 provided on the tip of the single crystal pulling bar 32 comes in contact with the molten material solution 22 in the crucible 20 and the single crystal pulling bar 32 is thereafter pulled up so that a single crystal 36 is grown under the seed crystal 34.

Figure 2:
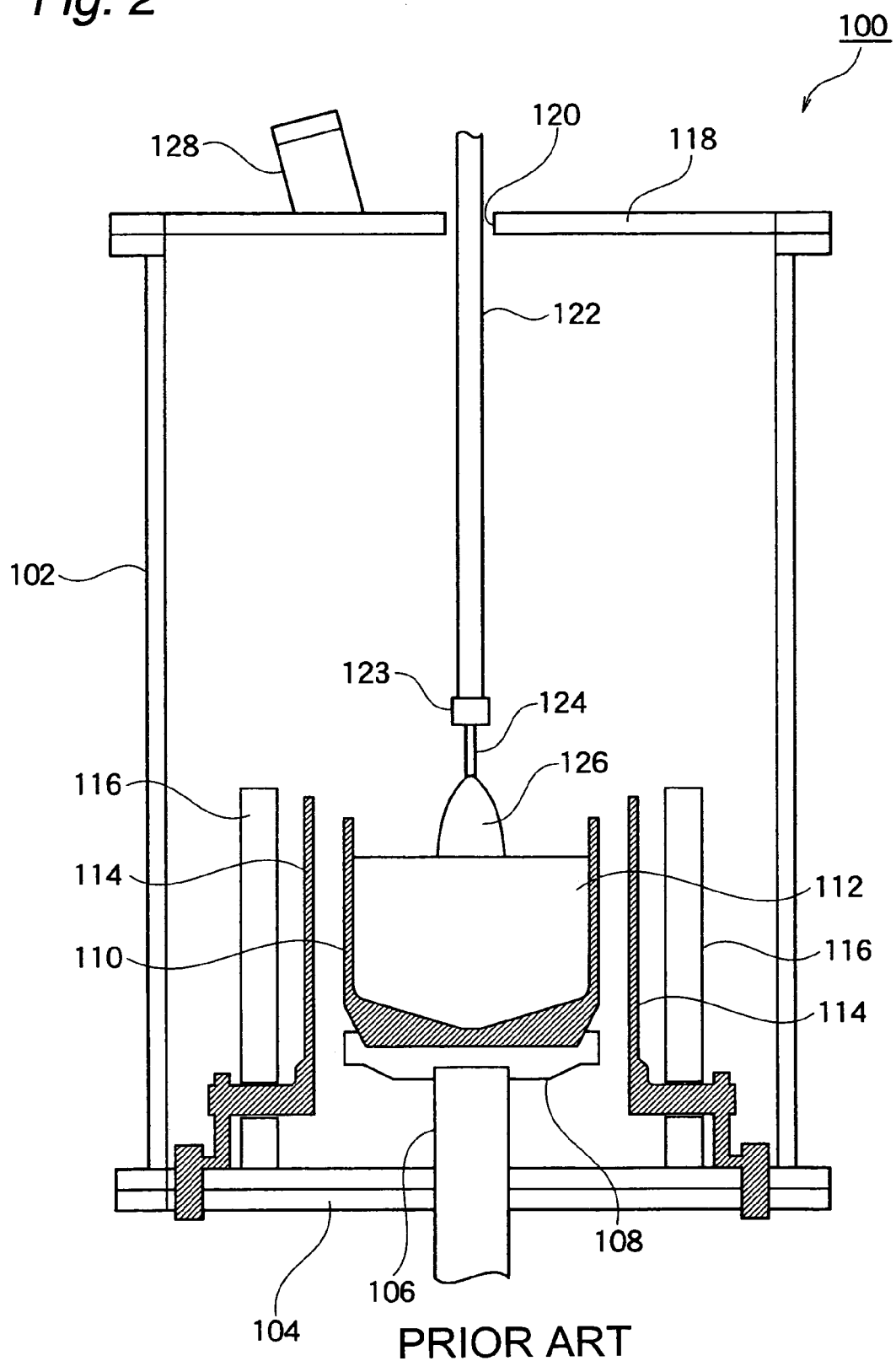
FIG. 2 is a schematic view showing a conventional single crystal pulling apparatus.
Figure 3:
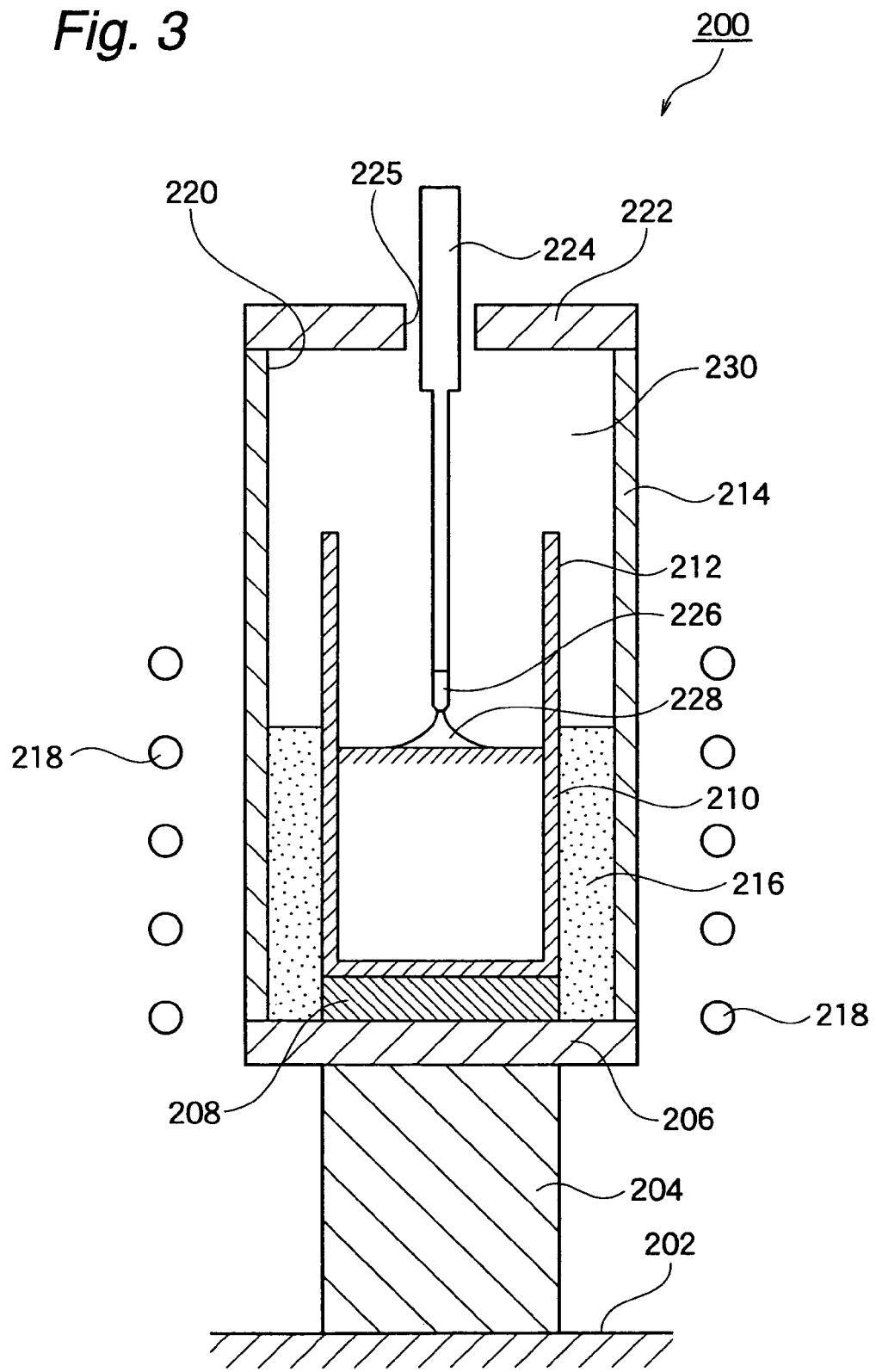
FIG. 3 is a schematic view showing a conventional single crystal pulling apparatus.
Figure 4:
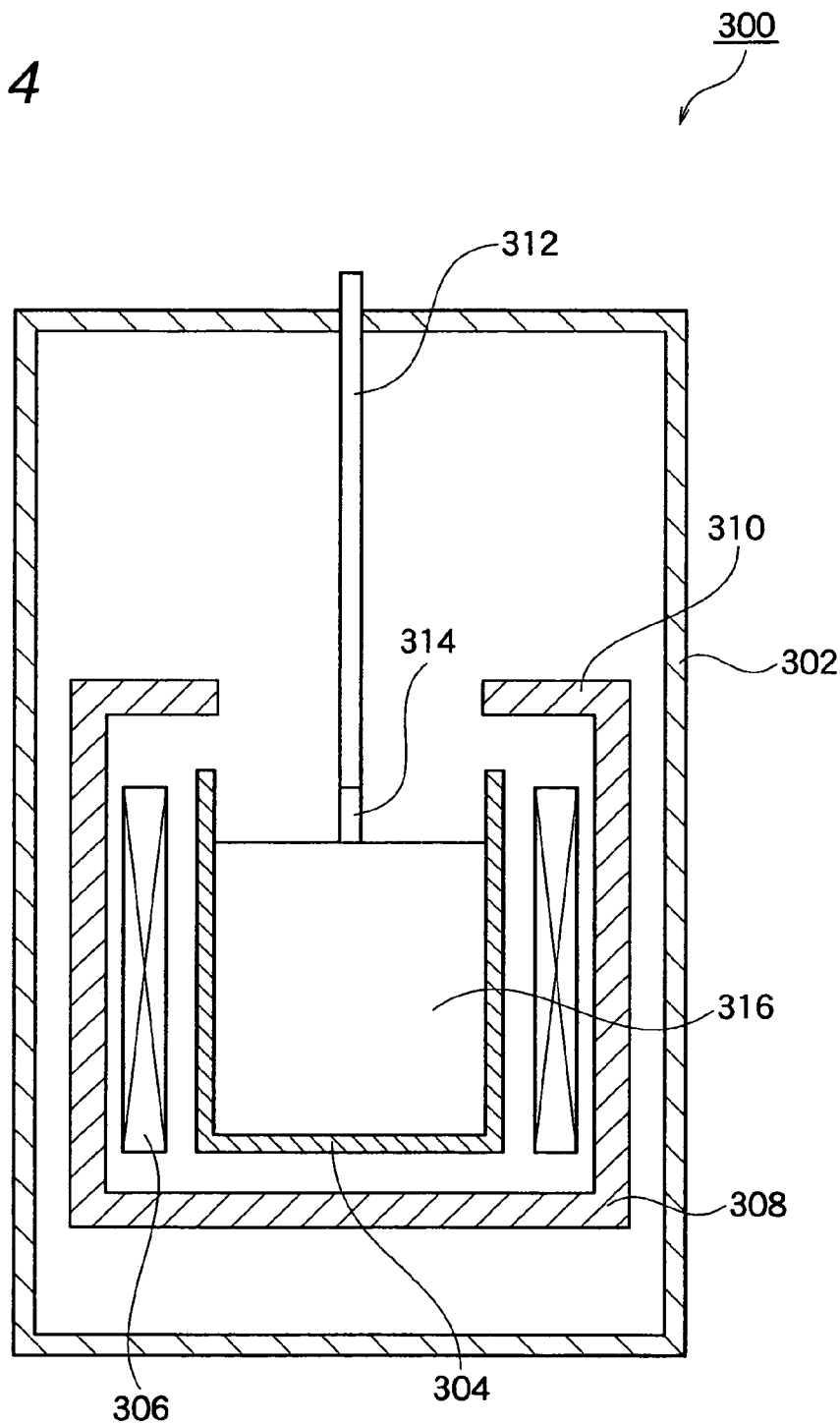
FIG. 4 is a schematic view showing a conventional single crystal pulling apparatus.

In the single crystal pulling apparatus of FIG. 1, the heat insulating wall 26 is extended to be upward longer than that in the single crystal pulling apparatus used for manufacturing a single crystal of silicon or the like shown in FIG. 2. In addition, the heat insulating wall 26 surrounds (circularly encloses) a whole circumference from a lower end to an upper end in the crucible 20, and furthermore, surrounds the side peripheral portion of a single crystal pulling region 38 provided thereabove.

In the present invention, the single crystal pulling region 38 implies a region from a height of the upper end of the crucible 20 to a height that the upper end of the single crystal 36 of a metal fluoride to be grown (that is, a lower end plane of a seed crystal) reaches at the end of pulling, in the upper part of the crucible 20 in the chamber 12.

In this case, the uppermost portion of the single crystal pulling region 38 is varied depending on the length of the single crystal 36 to be pulled, and usually, is generally positioned in a place which is higher than the upper end of the crucible 20 by 50 to 500%, and particularly suitably, 100 to 300% of the maximum inside diameter of the crucible 20.

The height of the upper end of the heat insulating wall 26 is set in such a manner that the single crystal pulling region 38 having such a size is sufficiently held in a single crystal pulling chamber which will be described below. If the upper end of the heat insulating wall 26 is much higher than the uppermost portion of the single crystal pulling region 38, a temperature retaining effect becomes excessive so that a single crystal cannot be obtained. For this reason, it is preferable that the height should be selected from the same range as that of the uppermost portion of the single crystal pulling region 38.

In the present invention, the heat insulating wall 26 formed by a well-known heat insulating material can be employed without limit. In order to enhance the effect of suppressing the generation of a crack on the single crystal 36, a coefficient of thermal conductivity in a direction of a thickness is preferably 100 W/m$^2$·K or less, and more preferably 1 to 50 W/m$^2$·K.

In the present invention, the coefficient of thermal conductivity in the direction of the thickness represents a value obtained by dividing a mean thermal conductivity (W/m·K) at 1500° C. in the direction of the thickness of an object by a thickness (m).

The material of the heat insulating wall 26 having such a coefficient of thermal conductivity preferably has a thermal conductivity of 0.2 to 1.0 W/m·K and more preferably 0.3 to 0.8 W/m·K at 1500° C. More specifically, examples of the material include a pitch type graphite mold heat insulating material (for example, trade name of "DONACARBO"), a fiber type graphite mold heat insulating material, a carbon felt type heat insulating material, a porous carbon type heat insulating material and the like.

The pitch type graphite mold heat insulating material is used particularly preferably because it can achieve a desired coefficient of thermal conductivity and is excellent in a resistance to a severe environment in the pulling and a mechanical strength.

If the heat insulating wall 26 is excellent in a heat insulating property as a whole, moreover, in addition to the wall member formed by a single material, it is also possible to employ a structure in which a plurality of plate-shaped members including at least one kind of heat insulating plate is provided, and furthermore, a structure in which these plate-shaped members are provided with a gas phase interposed therebetween. The thickness of the heat insulating wall 26 is not particularly restricted but is generally 3 to 10 cm.

In the chamber 12 seen from above, a position in which the heat insulating wall 26 is to be provided on the outside of the crucible 20 is not particularly restricted. Usually, the melting heater 24 is provided around the crucible 20. For this reason, the heat insulating wall 26 is generally positioned on the outside of the melting heater 24. If a great distance is made from the outer end of the crucible 20, the heat retaining effect of the single crystal pulling region 38 is deteriorated. Therefore, a distance of 20 to 100%, and particularly preferably 30 to 60% of the maximum inside diameter of the crucible 20 is made.

In the present invention, an upper end opening portion 40 formed on an upper end in the circular enclosure of the heat insulating wall 26 is closed by a ceiling board 44 on which an inserting hole 42 for the single crystal pulling bar 32 is at least formed. Since the single crystal pulling region 38 is held in a single crystal pulling chamber 46 formed by the heat insulating wall 26 and the ceiling board 44, consequently, a heat retaining property thereof can be enhanced greatly.

The present invention has the greatest feature that the ceiling board 44 having a coefficient of thermal conductivity of 1000 to 50000 W/m$^2$·K in a direction of a thickness is used in the single crystal pulling apparatus having the above-mentioned structure. In the single crystal pulling chamber 46, consequently, a heat radiation from the ceiling board 44 is also increased properly. Therefore, the single crystal pulling chamber is cooled slowly in a radial direction and a direction of a height. As a result, the nonuniformity of a temperature distribution can be improved remarkably.

According to the present invention, therefore, the single crystal 36 is cooled slowly and uniformly in the single crystal pulling region 38 so that a crystal can be grown more stably. Even if the single crystal is a metal fluoride such as calcium fluoride, consequently, it is possible to suppress the generation of a crack very highly.

In consideration of the expressing property of such an effect, the coefficient of thermal conductivity in the direction of the thickness of the ceiling board 44 is particularly preferably 1000 to 50000 $W/m^2 \cdot K$, and most preferably 2000 to 20000 $W/m^2 \cdot K$ in the present invention.

In most cases in which the coefficient of thermal conductivity in the direction of the thickness of the ceiling board 44 is smaller than 1000 $W/m^2 \cdot K$, a heat radiation from the ceiling board 44 becomes insufficient so that a temperature gradient in the direction of the height of the single crystal pulling region 38 is not sufficient and a single crystal is not generated. Also in the case in which the growth of the single crystal is generated, moreover, a temperature distribution in the single crystal pulling region 38 becomes nonuniform so that it is hard to highly suppress the generation of a crack. On the other hand, in the case in which the coefficient of thermal conductivity in the direction of the thickness of the ceiling board 44 is greater than 50000 $W/m^2 \cdot K$, the temperature gradient in the direction of the height is excessively increased, resulting in the generation of a large number of cracks.

The material of the ceiling board 44 having such a coefficient of thermal conductivity preferably has a thermal conductivity of 15 to 200 $W/m \cdot K$ and more preferably 30 to 150 $W/m \cdot K$ at 1500° C. More specifically, examples of the material include graphite, tungsten and the like.

The graphite is used particularly preferably because it can achieve a desired coefficient of thermal conductivity and is excellent in a resistance to a severe environment in the pulling and a mechanical strength.

If the ceiling board 44 satisfies the value of the coefficient of thermal conductivity as a whole, moreover, in addition to the plate member formed by a single material in the same manner as in case of the heat insulating wall 26, it is also possible to employ a structure in which a plurality of plate-shaped members including at least one kind of heat radiating plate is provided, and furthermore, a structure in which these plate-shaped members are provided with a gas phase interposed therebetween.

Moreover, the ceiling board 44 does not need to be flat-plate but takes any shape which closes the upper end opening portion 40 of the circular enclosure of the heat insulating wall 26 excluding an aperture portion which will be described below. For example, it is also possible to take the shapes of a truncated cone, an inverted truncated cone, a shade, an inverted shade, a dome, an inverted dome and the like.

In the present invention, if the ceiling board 44 is flat-plate, the height of the ceiling board 44 is equal to that of the upper end of the heat insulating wall 26. In the present invention, when the ceiling board 44 takes the shape of an upward convex from the upper end of the heat insulating wall 26 described above, moreover, the height of the highest portion is set to be the height of the ceiling board.

In the present invention, when the ceiling board 44 takes the shape of a downward concave from the upper end of the heat insulating wall 26 described above, furthermore, the height of the lowest portion is set to be that of the ceiling board 44. In the same manner as the height of the flat-plate ceiling board, it is effective that the height of the ceiling board which is not flat-plate is also set to be the height of the upper end of the heat insulating wall 26, that is, the same ceiling board is positioned in a higher place than the upper end of the crucible 20 by 50 to 500% of the maximum inside diameter of the crucible 20.

The thickness of the ceiling board 44 is not particularly restricted but is generally 0.3 to 3 cm and preferably 0.5 to 1.5 cm.

In the present invention, in addition to the inserting hole 42 of the single crystal pulling bar 32, the ceiling board 44 may be properly provided with an observation hole for maintaining a field of view from the inspection window 48 provided on the top of the chamber, a working hole for putting in a mechanism for scooping a solid impurity floating over the surface of the molten material solution 22 and the like.

In the present invention, it is also possible to control the heat radiating property in the single crystal pulling chamber 46 by regulating the total opening area of the apertures formed on the ceiling board 44. An upward gradient of a reduction in a temperature of the single crystal pulling region 38 can be controlled to be proper for pulling a single crystal of a metal fluoride. When the coefficient of thermal conductivity of the ceiling board 44 is not controlled to have the value described above but the gradient of the temperature is controlled by simply regulating the total opening area of the apertures, however, the generation of a crack cannot be prevented highly, which is not preferable.

The total opening area of the apertures is preferably 5 to 60% of the opening area of the upper end in the circular enclosure of the heat insulating wall 26 and particularly preferably 8 to 40%.

In the case in which the characteristic structure according to the present invention is employed in a large-sized single crystal pulling apparatus for a metal fluoride in which a crack is generated on a single crystal particularly remarkably and a crucible has a inside diameter of 11 cm or more, advantages can be produced particularly remarkably, which is suitable.

Next, description will be given to the other structures of the single crystal pulling apparatus according to the present invention. The melting heater 24 is not particularly restricted but a resistance heating method, an induction heating method or the like is used. It is preferable that an upper end of the heater 24 should have a height which is almost equal to or slightly greater than the height of the upper end of the crucible 20.

A partition wall 50 may be provided circumferentially between the melting heater 24 and the outer end of the crucible 20 in order to cause a radiant heat from the heater to be uniform. In order to produce the advantages of the present invention more remarkably, it is preferable that the upper end of the partition wall 50 should be slightly higher than that of the melting heater 24 and a lid member 52 for closing a gap between the partition wall 50 and the heat insulating wall 26 should be provided between the upper end and the heat insulating wall 26, thereby closing the gap to prevent the heat of the melting heater 24 from being let upward.

It is preferable that the materials of the partition wall 50 and the lid member 52 should be graphite.

In the single crystal pulling apparatus, it is preferable that the single crystal pulling bar 32, the support shaft 16, the inspection window 48 and the like should be sealed in airtightness by means of an O ring, a magnetic fluid seal or the like. When a leakage is generated from these portions in a process for melting a material metal fluoride or a process for raising a crystal, there is a possibility that a remarkable deterioration in quality such as coloring of a single crystal or a reduction in a transparency might be caused.

It is preferable that the material metal fluoride put in the crucible 20 should be subjected to a heating process under reduced pressure prior to melting to remove an adsorbed moisture. While a well-known vacuum pump for evacuating an apparatus can be used, it is preferable to use a combination of a rotary pump and an oil diffusing pump, or a combination of a rotary pump and a turbo molecular pump.

As shown in FIG. 1, furthermore, a bottom heat insulating member 54 is provided on the inner peripheral side of the heat insulating wall 26 at the bottom wall 14 of the chamber 12. Moreover, a heat insulating support shaft airtight seal member 56 is provided between the periphery of the support shaft 16 and the bottom heat insulating member 54. Furthermore, a heat insulating bottom airtight seal member 58 is provided between the lower end of the heat insulating wall 26, the outer periphery of the bottom heat insulating member 54 and the melting heater 24.

Consequently, it is possible to prevent the heat from being let out of the bottom portion of the chamber 12 and to prevent the atmosphere of the chamber 12 from leaking to the outside.

The materials of the bottom heat insulating member 54, the support shaft airtight seal member 56 and the bottom airtight seal member 58 are not particularly restricted but any material having the same coefficient of thermal conductivity in a direction of a thickness as that of the heat insulating wall 26 which is formed by a well-known heat insulating material can be employed without limit.

The pulling apparatus according to the present invention is used for manufacturing single crystals of metal fluorides in which a crack is generated particularly remarkably in the pull of the single crystal. Examples of the metal fluoride include calcium fluoride, magnesium fluoride, barium fluoride, lithium fluoride, aluminum fluoride, $LiCaAlF_6$ and the like. In the case in which the pulling apparatus is applied to the manufacture of the single crystal of calcium fluoride, particularly, the advantages can be produced most remarkably.

Referring to a specific operating process of the pulling method, a well-known method executed by using a general single crystal pulling apparatus can be carried out without limit. It is preferable that material metal fluorides to be put in a crucible subjected to a sufficient purifying process, particularly, a moisture removing process should be used. The material fluoride can be molten and the single crystal can be grown in an inactive gas atmosphere or in a vacuum.

It is preferable that the single crystal should be pulled up on the condition that heating is carried out to a melting point to the melting point+100° C. at the measuring temperature of a bottom portion for the crucible of the material fluoride, for example, at a temperature of 1380 to 1480° C. if the metal fluoride is calcium fluoride, and it is preferable that a temperature rising speed should be 50 to 500° C./hour.

In order to eliminate the influence of the residual moisture, it is preferable that the pulling method should be executed under the presence of a scavenger. For the scavenger, there is used a solid scavenger such as zinc fluoride, lead fluoride or polytetrafluoroethylene prepared together with a material metal fluoride, or a gaseous scavenger such as carbon tetrafluoride introduced as an atmosphere in the chamber.

It is preferable that a single crystal having the same composition as that of a metal fluoride to be grown should be used for a seed crystal to be utilized for the pulling method. While the grown surface of the seed crystal can be selected optionally, a (111) plane can be suitably used when the seed crystal of the metal fluoride is to be utilized. During the raising of a crystal, it is preferable that these seed crystals should be rotated around a pulling axis. On the other hand, it is preferable that the crucible should also be rotated in an opposite direction to the direction of the rotation of the seed crystal.

While examples of the present invention will be described below, the present invention is not restricted to these examples.

EXAMPLE 1

By using the single crystal pulling apparatus shown in FIG. 1, a single crystal of calcium fluoride was manufactured.

The crucible 20 formed of high-purity graphite provided in the chamber 12 had an inside diameter of 38 cm (an outside diameter of 40 cm) and a height of 30 cm. The heat insulating wall 26 was formed by a pitch type graphite mold heat insulating material and a coefficient of thermal conductivity in the direction of a thickness was 9 $W/m^2 \cdot K$. On the other hand, the ceiling board 44 was formed of graphite and the coefficient of thermal conductivity in the direction of the thickness was 5000 $W/m^2 \cdot K$.

Moreover, the ceiling board 44 was provided with an observation hole for maintaining a field of view from the inspection window 48 in addition to the inserting hole (having a diameter of 14 cm) 42 of the single crystal pulling bar 32 which is shown, and a total opening area thereof was 13% of the opening area of an upper end in the circular enclosure of the heat insulating wall 26.

Furthermore, the ceiling board 44 was higher than the upper end of the crucible 20 by 160% of the maximum inside diameter of the crucible 20. A distance between the heat insulating wall 26 and the outer end of the crucible 20 was 9 cm (25% of the maximum inside diameter of the crucible 20).

50 kg of a high-purity material calcium fluoride lump subjected to a sufficient purifying process and moisture removing process and 0.1% of high-purity zinc fluoride to be a scavenger were put in the crucible 20 provided in the chamber 12 and the chamber 12 was evacuated. Then, electricity was given to the melting heater 24 to start to heat the material, thereby raising a temperature to 250° C. The material was held for 2 hours at this temperature. After the holding, a rise in the temperature was started again. When the temperature reaches 600° C., an evacuating line was blocked and high-purity argon was supplied into the chamber 12 to maintain an internal pressure to be 106.4 KPa.

After the material was held for 40 minutes at 1480° C. at which it was completely molten, a heater output was reduced and the material was held for 120 minutes at 1440° C. Then, the single crystal pulling bar 32 was hung down to cause the lower end plate of the seed crystal 34 to come in contact with the surface of the molten material solution 22. Thus, a single crystal was started to be grown.

The seed crystal 34 was rotated at 15 times/minute, while the crucible 20 was also rotated in an opposite direction thereto at once/minute, and the seed crystal 34 was pulled up for 40 hours at 5 mm/hour in this state. In a visual observation, consequently, a crack was not generated on the single crystal 36 at all but a single crystal could be grown smoothly. After the raising was ended, the temperature was reduced to an ordinary temperature.

As described above, a single crystal of calcium fluoride having a maximum diameter of 28 cm and a weight of 27 kg was obtained.

EXAMPLE 2

In the single crystal pulling apparatus shown in FIG. 1 which was used in the example 1, a single crystal of calcium fluoride was manufactured in the same manner as in the example 1 except that the ceiling board 44 formed of tungsten and having a coefficient of thermal conductivity in the direction of a thickness of 20000 W/m$^2$·K was used. The generation of a crack was not observed at all in the single crystal of the calcium fluoride thus obtained and a single crystal could be grown smoothly.

COMPARATIVE EXAMPLE 1

In the single crystal pulling apparatus shown in FIG. 1 which was used in the example 1, a single crystal of calcium fluoride was manufactured in the same manner as in the example 1 except that the ceiling board 44 was excluded. As a result, five cracks were observed.

COMPARATIVE EXAMPLE 2

In the single crystal pulling apparatus shown in FIG. 1 which was used in the example 1, a single crystal of calcium fluoride was manufactured in the same manner as in the example 1 except that the ceiling board 44 formed of a pitch type graphite mold heat insulating material and having a coefficient of thermal conductivity in the direction of a thickness of 15 W/m$^2$·K was used. As a result, a crystal was not obtained.

COMPARATIVE EXAMPLE 3

In the single crystal pulling apparatus shown in FIG. 1 which was used in the example 1, a single crystal of calcium fluoride was manufactured in the same manner as in the example 1 except that the ceiling board 44 formed of a pitch type graphite mold heat insulating material and having a coefficient of thermal conductivity in the direction of a thickness of 15 W/m$^2$·K was used and the ceiling board 44 was provided with only the inserting hole of a single crystal pulling bar having a diameter of 30 cm (an opening area was 30% of the opening area of an upper end in the circular enclosure of the heat insulating wall 26). As a result, two cracks were observed.

COMPARATIVE EXAMPLE 4

For a single crystal pulling apparatus, the inside diameter of a crucible was set to be 9 cm and other sizes were decreased proportionally excluding the ceiling board 44 in the apparatus shown in FIG. 1 which was used in the example 1.

0.35 Kg of a single crystal of calcium fluoride having a maximum diameter of 6 cm was manufactured in the same manner as in the example 1 except that 0.7 Kg of a material calcium fluoride lump was put in such a single crystal pulling apparatus. As a result, one crack was observed.

According to the single crystal pulling apparatus in accordance with the present invention, the single crystal pulling region can be held in the single crystal pulling chamber formed by the heat insulating wall and the ceiling board. Therefore, the single crystal pulling region is excellent in a heat retaining property. In a temperature distribution in the single crystal pulling region, a temperature is reduced upward, uniformly and slowly. Consequently, it is possible to stably grow the single crystal of a metal fluoride and to highly suppress the generation of a crack on the single crystal which is manufactured.

According to the single crystal pulling apparatus in accordance with the present invention, moreover, the coefficient of thermal conductivity in the direction of the thickness of the heat insulating wall is 100 W/m$^2$·K or less. Therefore, the single crystal pulling region is particularly excellent in the heat retaining property and the above-mentioned advantages can be produced remarkably.

According to the single crystal pulling apparatus in accordance with the present invention, furthermore, the ceiling board is a graphite plate. Therefore, it is possible to form the ceiling board by a material which has a desirable coefficient of thermal conductivity and is also excellent in a resistance to a severe environment during pulling and a mechanical strength.

According to the single crystal pulling apparatus in accordance with the present invention, moreover, the ceiling board is positioned in a higher place than the upper end of the crucible by 50 to 500% of the maximum inside diameter of the crucible. Consequently, it is possible to sufficiently maintain a single crystal pulling region required for pulling a single crystal of a metal fluoride having a practical size in the inner space portion of the single crystal pulling chamber.

According to the single crystal pulling apparatus in accordance with the present invention, furthermore, the total opening area of the apertures formed on the ceiling board is 5 to 60% of the opening area of the upper end in the circular enclosure of the heat insulating wall. By regulating the total opening area of the apertures formed on the ceiling board, therefore, it is possible to control a heat radiating property in the single crystal pulling chamber and to control the upward gradient of a reduction in a temperature in the single crystal pulling region to be proper for pulling the single crystal of the metal fluoride. As a result, it is possible to well balance the temperature retaining property in the single crystal pulling region with the uniformly and slowly upward reduction in the temperature in the region.

The calcium fluoride is a material in which a crack is generated on the single crystal particularly remarkably. According to the single crystal pulling apparatus in accordance with the present invention, in the single crystal pulling region, even if the single crystal is the calcium fluoride, the single crystal is cooled slowly and uniformly and a crystal is grown more stably. Therefore, the calcium fluoride in which a single crystal has an extremely low crystal growth speed can suppress the generation of the crack very highly.

Furthermore, in the case in which the single crystal of the metal fluoride is manufactured by a large-sized apparatus in which a crucible has a inside diameter of 11 cm or more, which lead to the generation of a crack remarkably. According to the single crystal pulling apparatus in accordance with the present invention, consequently, even in case of such a large-sized apparatus, the advantages of the present invention can be produced particularly remarkably and a single crystal having no large crack can be manufactured.

What is claimed is:

1. A single crystal pulling apparatus for a metal fluoride, comprising:
   a chamber constituting a crystal growth furnace;
   a crucible provided in the chamber for filling with a molten solution of a single crystal material;
   a melting heater provided to surround the crucible;
   a vertically movable single crystal pulling bar for attaching a seed crystal on a tip and adapted to come in contact with the molten solution of the single crystal material in the crucible;
   a heat insulating wall provided in the chamber to surround at least a peripheral side portion of a single crystal pulling region in an upper part of the crucible;
   a ceiling board for closing an opening portion of an upper end in an upper part of the heat insulating wall; and
   a single crystal pulling chamber surrounded by the heat insulating wall and the ceiling board, wherein the single crystal pulling chamber is defined by a single crystal pulling region which vertically extends from an upper end of the crucible to a height that an upper end of the single crystal of a metal fluoride to be grown reaches at the end of pulling, terminating at a location below said ceiling board; and
   wherein the ceiling board is provided with at least an inserting hole for inserting the single crystal pulling bar, and the ceiling board has a coefficient of thermal conductivity in a direction of a thickness of the ceiling board of 1000 to 50000 W/m²·K.

2. The single crystal pulling apparatus for a metal fluoride according to claim 1, wherein a coefficient of thermal conductivity in a direction of a thickness of the heat insulating wall is 100 W/m²·K or less.

3. The single crystal pulling apparatus for a metal fluoride according to claim 1, wherein the ceiling board is a graphite plate.

4. The single crystal pulling apparatus for a metal fluoride according to claim 1, wherein the ceiling board is positioned in a higher place than an upper end of the crucible by 50 to 500% of a maximum inside diameter of the crucible.

5. The single crystal pulling apparatus for a metal fluoride according to claim 1, wherein a total opening area of apertures formed on the ceiling board is 5 to 60% of an opening area of an upper end in a circular enclosure of the heat insulating wall.

6. The single crystal pulling apparatus for a metal fluoride according to claim 1, wherein the metal fluoride is calcium fluoride.

7. The single crystal pulling apparatus for a metal fluoride according to claim 1, wherein the crucible has an inside diameter of 11 cm or more.

8. The single crystal pulling apparatus of claim 1 which includes a cylindrically-shaped partition wall positioned circumferentially between the melting heater and the crucible, said partition wall terminating at a top edge located above the melting heater, and an annular lid member extending from the top edge of said partition wall to the heat insulating wall, whereby upward radiation of heat from the melting heater is minimized.

* * * * *